United States Patent [19]

Ortiz et al.

[11] Patent Number: 5,757,236
[45] Date of Patent: May 26, 1998

[54] AMPLIFIER BIAS CIRCUIT AND METHOD

[75] Inventors: Jeffery P. Ortiz, Chandler, Ariz.; Jin D. Kim, Mundelein, Ill.

[73] Assignee: Motorola, Inc., Schaumburg, Ill.

[21] Appl. No.: 673,485

[22] Filed: Jul. 1, 1996

[51] Int. Cl.$^6$ .................................................. H03F 3/16
[52] U.S. Cl. .......................................... 330/296; 330/277
[58] Field of Search ................................. 330/129, 130, 330/200, 204, 261, 277, 296, 285; 455/127

[56] References Cited

U.S. PATENT DOCUMENTS

| | | | |
|---|---|---|---|
| 3,870,967 | 3/1975 | Wisseman | 330/261 |
| 4,150,366 | 4/1979 | Price | 340/347 |
| 4,194,164 | 3/1980 | Owen | 330/130 |
| 4,207,538 | 6/1980 | Goel | 330/277 |
| 4,387,346 | 6/1983 | Fackler | 455/127 X |
| 5,278,517 | 1/1994 | Fujita | 330/285 X |
| 5,506,544 | 4/1996 | Staudinger et al. | 330/277 |

*Primary Examiner*—James B. Mullins
*Attorney, Agent, or Firm*—Rennie William Dover

[57] ABSTRACT

A resistor network bias circuit (24) and method is suitable for use in monolithic circuits. The method involves selecting resistors set a quiescent current for a two-stage power amplifier. The bias circuit (24) offsets the gate voltage for a first transistor (14) and a second N-channel depletion mode MESFET transistor (22) to maintain substantially constant drain current for the power amplifier over a range of threshold voltages. Selectable metal links (33–83) serially connected to resistors (30–80) provide parallel resistor combinations (36–86) for setting the quiescent currents of transistors (14 and 22).

18 Claims, 1 Drawing Sheet

5,757,236

1

AMPLIFIER BIAS CIRCUIT AND METHOD

BACKGROUND OF THE INVENTION

The present invention relates, in general, to depletion mode transistor circuits and, more particularly, to a bias circuit for minimizing quiescent current variation in a depletion mode field effect transistor.

Radio Frequency (RF) amplifiers are commonly used in applications such as cellular telephones to amplify high frequency signals in the 800–900 MHz range. The amplified RF signal is transmitted over airways to a receiving unit. A typical RF amplifier includes a Metal Semiconductor Field Effect Transistor (MESFET) that receives an RF input signal (to be amplified) at its gate. The drain of the MESFET is coupled through an RF choke to a positive power supply conductor for providing the amplified RF output signal of the MESFET amplifier.

The gate of the MESFET must be biased for proper operation. The bias point along with the load line and input RF voltage waveform determine the drain current through the power transistor. In order to achieve maximum efficiency, there is a trade-off between maximum transmitted RF power and minimum power consumption. Minimizing power consumption is especially important in battery supplied applications.

A two resistor divider network is often used to bias the power MESFET. The resistors are typically laser trimmed to adjust the bias of each amplifier to compensate for process variation. However, resistor trimming is an expensive manufacturing step.

Other known bias circuits include complex digital and analog circuitry that sample the drain current of the power transistor and make dynamic adjustments to the bias voltage. However, the Digital/Analog (D/A) converter used to set the gate voltage of the power transistor is a relatively expensive solution to the bias problem. The D/A converter requires circuit board space and requires Read Only Memory (ROM) for storing the digital word that sets the bias voltage.

Another bias method in the prior art uses a current mirror integrated onto the same substrate as the power transistors. The current mirror draws a large current and has poor accuracy, however, due to the large current ratio existing between the transistors in a multistage power amplifier and the current mirror.

It would be desirable to have a simple bias circuit that minimizes the quiescent current variations for depletion mode FET power amplifiers. The method should be cost effective and suitable for semiconductor manufacturing.

DETAILED DESCRIPTION OF THE DRAWINGS

Figure 1:
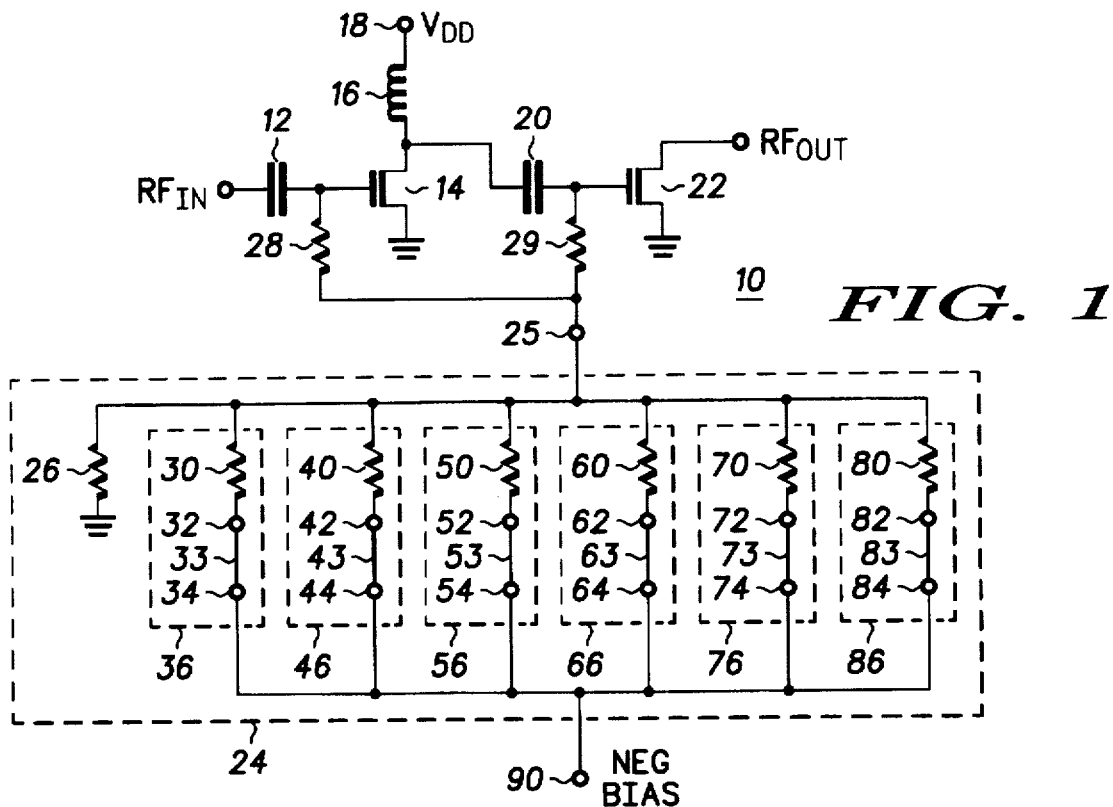
FIG. 1 is a schematic diagram illustrating a bias circuit for a MESFET amplifier in accordance with an embodiment of the present invention.

Referring to FIG. 1, a Radio Frequency (RF) amplifier 10 is shown suitable for manufacturing as an Integrated Circuit (IC) using conventional monolithic IC processes. An input signal, $RF_{IN}$, operating at about 800–900 MHz is AC-coupled through capacitor 12 to the gate of transistor 14. Transistor 14 is a gallium arsenide depletion mode Metal Semiconductor Field Effect Transistor (MESFET) operating as a power transistor that conducts about twenty-five milliamps of quiescent current in the preferred embodiment. The source of transistor 14 is connected to ground potential. The drain of transistor 14 is coupled through RF choke 16 to power supply conductor 18 operating at about 3.5 volts. The RF choke is selected at about five nanoHenries in the preferred embodiment.

The output from the first stage of a two-stage MESFET power amplifier in FIG. 1 is taken at the drain of MESFET power transistor 14 and AC-coupled through capacitor 20 to the gate of transistor 22. Transistor 22 can be a gallium arsenide depletion mode MESFET power transistor that conducts about one-hundred and fifty milliamps of quiescent current in the preferred embodiment. The source of transistor 22 is connected to ground potential. The output from the second stage of a two-stage power amplifier is taken at the open drain of transistor 22, which provides the output signal $RF_{OUT}$.

A bias circuit 24 is coupled to the gates of transistors 14 and 22 for setting the bias point at which transistors 14 and 22 operate. Bias circuit 24 comprises a plurality of parallel combinations 36–86, with each combination 36–86 comprising a resistor serially connected to a metal link. In particular, combination 36 has resistor 30 serially connected to metal link 33, such that resistor 30 is connected between terminals 32 and 25 and metal link 33 is connected between terminals 32 and 34. Terminal 34 is connected to power supply conductor negative (neg) bias terminal 90. Also, combination 46 has resistor 40 serially connected to metal link 43, such that resistor 40 is connected between terminals 42 and 25 and metal link 43 is connected between terminals 42 and 44. Terminal 44 is connected to neg bias terminal 90.

Likewise, combination 56 has resistor 50 serially connected to metal link 53, such that resistor 50 is connected between terminals 52 and 25 and metal link 53 is connected between terminals 52 and 54. Terminal 54 is connected to neg bias terminal 90. Combination 66 has resistor 60 serially connected to metal link 63, such that resistor 60 is connected between terminals 62 and 25 and metal link 63 is connected between terminals 62 and 64. Terminal 64 is connected to neg bias terminal 90. Combination 76 has resistor 70 serially connected to metal link 73, such that resistor 70 is connected between terminals 72 and 25 and metal link 73 is connected between terminals 72 and 74. Terminal 74 is connected to neg bias terminal 90. Also, combination 86 has resistor 80 serially connected to metal link 83, such that resistor 80 is connected between terminals 82 and 25 and metal link 83 is connected between terminals 82 and 84. Terminal 84 is connected to neg bias terminal 90.

Combinations 36–86 of bias circuit 24 are connected in parallel and as such share terminal 25 and neg bias terminal 90. The embodiment can have any number of serially connected resistor and metal link combinations, such as combinations 36–86, depending upon the desired number of resistances available for biasing transistors 14 and 22. The preferred embodiment has six such combinations.

Resistor 26 of bias circuit 24 is connected between terminal 25 and ground potential. In the preferred embodiment, resistor 26 has a value of about seventeen-hundred and fifty ohms. Resistor 28 is connected between terminal 25 and the gate of MESFET transistor 14. In the preferred embodiment, resistor 28 has a value of about three-hundred ohms. Resistor 29 is connected between terminal 25 and the gate of MESFET transistor 22. In the preferred embodiment, resistor 29 has a value of about three-hundred ohms. Resistors 28 and 29 have minimal affect on the bias voltage at terminal 25 generated by bias circuit 24. Resistors 28 and 29 provide Alternating Current (AC) decoupling.

At the completion of the processing phase by which semiconductor layers are formed and impurities deposited or implanted in the manufacture of MESFET devices, MESFET transistors 14 and 22 can be probed on the integrated circuit (not shown) as power amplifiers. In the preferred embodiment, transistors 14 and 22 are N-channel depletion mode Metal Semiconductor Field Effect Transistors, each with first, second, third, and fourth terminals as gate, drain, source, and well, respectively. A well region of P-type conductivity and a source region, channel region, and drain region of N-type conductivity are disposed in a semiconductor Gallium Arsenide (GaAs) substrate (not shown). A refractory metal compound, capable of forming a Schottky contact to GaAs, can be deposited for forming the gate terminals for transistors 14 and 22. Also, patterned metalized regions can form ohmic contacts to the source and drain regions as the source and drain terminals, respectively, for transistors 14 and 22.

For determining device characteristics, probe needles can be placed at the metal terminals for the gate, drain, source, and well of MESFET transistor 14. In particular, a drain-to-source voltage of about 3.5 volts can be applied to transistor 14 and a variable gate-to-source voltage in the range of negative three to zero volts can be applied to transistor 14 while the terminal contacting the well for transistor 14 and neg bias terminal 90 are provided a voltage at ground potential. With the four terminals of transistor 14 supplied with voltages such that transistor 14 is operational, a gate-to-source bias voltage value can be selected in accordance with transistor 14 conducting a drain-to-source current of about twenty-five milliamps in the preferred embodiment. (Additional detailed information on these biasing steps will be discussed later in the detailed description.)

The operation of amplifier 10 proceeds as follows. Bias circuit 24 generates a gate-to-source bias voltage at the gates of transistors 14 and 22 that maintains a constant drain current. The bias voltage generated by bias circuit 24 is set by the selection of resistor combinations 36–86 in series with resistor 26 as voltage dividers for closely approximating the gate-to-source voltage value determined during probe.

In the preferred embodiment, bias circuit 24 connects a negative bias of about −3.4 volts at neg bias terminal 90. The parallel connected combinations 36–86 provide a parallel resistance with a value of about six-hundred and fifty ohms. This parallel resistance is connected serially with resistor 26 such that terminal 25 provides a voltage of about −2.5 volts as a gate-to-source bias for transistors 14 and 22.

Each of the parallel connected combinations 36–86 can be selectively removed, either individually or in groups, by opening metal links 33–83. An open metal link in the metal link series 33–83 removes the corresponding resistor of the serially connected resistors 30–80 from affecting the parallel resistance. For instance, an open metal link 33 removes resistor 30 from affecting the resistance of the parallel combination of resistors 40–80. An increased parallel resistance provided by resistors 40–80 will provide a more positive gate-to-source voltage at terminal 25 for transistors 14 and 22. Thus, the range in gate-to-source voltage at terminal 25 provided as a bias to transistors 14 and 22 ranges from about −3.0 volts (metal links 33–83 are in place) to about −2.0 volts (all metal links 33–83 are opened except for one metal link).

In the preferred embodiment, resistor 30 has a value of about five-hundred ohms. The other resistors 40–80 are weighted values from resistor 30 such that resistor 40 has twice the resistance value, or about one-thousand ohms. Resistor 50 has a value of about two-thousand ohms. Resistor 60 has a value of about four-thousand ohms. Resistor 70 has a value of about eight-thousand ohms and resistor 80 has a value of about sixteen-thousand ohms.

The initial parallel resistor combination provided by combinations 36–86 provides a gate-to-source voltage of about −3.0 volts at terminal 25 that provides the minimum drain-to-source current in N-channel depletion mode transistors 14 and 22. By opening any of metal links 33–83, thereby selectively removing corresponding resistors of the serially connected resistors 30–80, the voltage at terminal 25 increases from the most negative voltage value to a more positive voltage value. A more positive voltage at terminal 25 provides an increased gate-to-source bias voltage and transistors 14 and 22 have an increased drain-to-source current. When resistors 30–80 are removed from affecting the parallel resistance provided by combinations 36–86, the voltage at terminal 25 is about zero volts and a maximum drain-to-source current is provided by transistors 14 and 22.

Combinations 36–86 are spaced apart by approximately one-hundred microns, allowing probe needles to be selectively placed at terminals 32–82. An additional probe needle placed at neg bias terminal 90 provides a voltage potential difference of about five volts to probe needles selectively placed at terminals 32–82. Energy sufficient for reflowing the metal interconnect for the selected metal links 33–83, or otherwise providing an electrical open in the conduction path between the selected terminals 32–82 and neg bias terminal 90 is provided.

In the preferred embodiment, a variable gate-to-source bias voltage value for transistor 22 is measured and stored when transistor 22 operates to conduct one-hundred and fifty milliamps of drain-to-source current. Bias circuit 24 functions to generate a close approximation to this stored bias voltage value. In the preferred embodiment, a look-up table (is referred to in the method flow chart) or a memory table provides entries for voltage values and entries for associated combinations of resistors 30–80. For example, one entry in the look-up table would provide a pairing of a voltage bias value for terminal 25 for a parallel combination of resistors 30, 40, and 70 when serially connected to resistor 26 value and together coupled between neg bias terminal 90 and ground. Another entry in the look-up table would provide a pairing of a voltage bias value for terminal 25 for a parallel combination of resistors 30, 40, and 80 when serially connected to resistor 26, etc.

Thus, pairings of table entries are in accordance with differing combinations of parallel resistors 30–80 serially connected in a resistor divider with resistor 26 for generating a voltage bias at terminal 25. A comparison of the target probe voltage value attained as the gate-to-source voltage for transistor 22 when conducting about one-hundred and fifty milliamps of current and the voltage data entries contained in the look-up table provides the resistors 30–80 that should be selected in bias circuit 24. Thus, the table entry with the voltage value closest to the target probe voltage has entries for the resistors such that when the selected resistors 30–80 are connected in parallel, terminal 25 will supply a gate-to-source voltage for biasing transistor 22 to provide the one-hundred and fifty milliamps of quiescent current. In accordance with the output from the look-up table, probe needles can be placed at selected terminals 32–82 and a voltage differential to terminal 90 applied that is sufficient for reflowing selected metal links 33–83 until the conduction path opens.

In an alternate embodiment, the look-up table contains a pairing of entries for selected metal links and voltages, such that when the metal links are open, bias circuit 24 generates the voltage entry at terminal 25.

Figure 2:
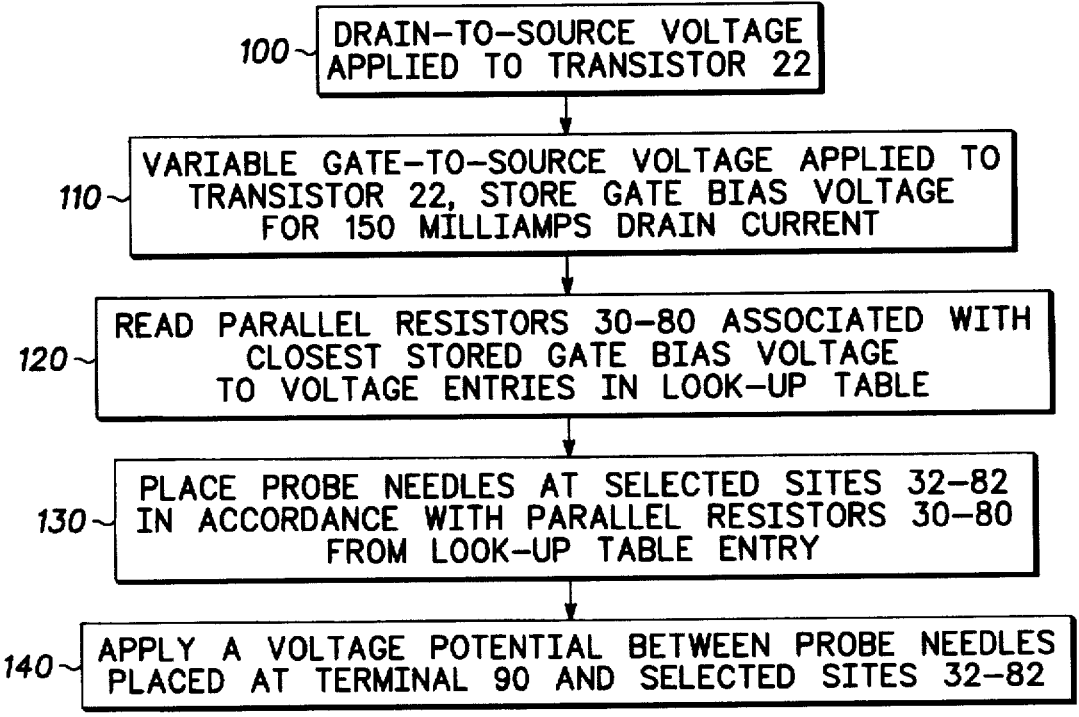
FIG. 2 is a flow diagram of a method for setting a gate-to-source bias voltage for a MESFET transistor in accordance with a particular drain-to-source current.

FIG. 2 is a flow diagram for a method of setting a particular gate bias voltage for MESFET transistors 14 and 22. Subsequent to the processing steps in the manufacture of MESFET transistors 14 and 22, a gate-to-source voltage is determined for operating transistor 22 at a particular drain-to-source current. The first step, as shown in box 100, powers transistor 22 by applying a drain-to-source voltage of about 3.5 volts. The second step, as shown in box 110, involves a variable gate-to-source voltage for determining a bias value at which transistor 22 conducts about one-hundred and fifty milliamps of drain-to-source current in the preferred embodiment. Step three, as shown in box 120 of FIG. 2, includes the step of a look-up table for determining a parallel resistor combination that provides a close approximation to the bias value as determined in step two. Step four, as shown in box 130, includes the step of placing probes at the selected terminals 32–82 (see FIG. 1) in accordance with the resistor combination in step three. Step five, as shown in box 140, includes the step of applying a voltage potential between neg bias terminal 90 (see FIG. 1) and a selected group of terminals 32–82 (see FIG. 1) for effecting an open conduction path in the selected combinations 36–86 (see FIG. 1).

One alternate embodiment for opening, for example, metal link 33 of the series metal links 33–83 would use a probe needle placed at neg bias terminal 90 and a probe needle placed at terminal 32. A sufficiently large applied voltage differential between the probe needles would reflow the metal and open metal link 33. The voltage at terminal 25 can be monitored and compared to the target gate-to-source voltage value. When bias circuit 24 provides a bias voltage at terminal 25 exceeding the target value, the probe at terminal 32 can be advanced to terminal 42. An applied voltage differential between the probe needles would reflow the metal and open metal link 43. Again, the voltage at terminal 25 can be monitored and compared to the target gate-to-source voltage value. The method can be continued until the target gate-to-source voltage value does not exceed the voltage at terminal 25.

By now it should be appreciated that the present invention provides a simple bias circuit that determines the MESFET quiescent current for depletion mode FET transistors 14 and 22. The resistor structure of bias circuit 24 can be modified by selectively opening metal links 33–83 which changes the parallel resistance of bias circuit 24 and thereby, the voltage generated at terminal 25 for supplying the bias to transistors 14 and 22. The method of selecting and opening conducting paths serially connected to resistors is cost effective and suitable for semiconductor manufacturing.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention. For instance, bias circuit 24 is applicable to setting an operating gate voltage for other semiconductor depletion mode Field Effect Transistors, including Heterojunction Field Effect Transistors (HFETs), Junction Field Effect Transistors (JFETs), etc. An alternate embodiment would use bias circuit 24 in conjunction with a current mirror (not shown) for providing a specified current.

Also, the number of serially connected metal links 33–83 and resistors 30–80 in combinations 36–86 provided in bias circuit 24 is not a limitation. Other embodiments can provide either more or less combinations 36–86. Smaller incremental voltage steps can be provided at terminal 25 by providing additional combinations 36–86 for generating the gate-to-source bias for transistors 14 and 22.

What is claimed is:

1. A power amplifier, comprising:

a power transistor having a gate coupled for receiving an input signal, a drain coupled for providing an output signal, and a source coupled to a first power supply conductor; and a bias circuit for generating a bias voltage for the gate of the power transistor to maintain a constant drain current, the bias circuit including, a plurality of parallel combinations comprising a metal link having an end serially coupled to a resistor, wherein each of the plurality of parallel combinations is coupled to the gate of the power transistor, and wherein the metal link can be opened by injecting an energy sufficient for reflowing the metal link to selectively remove a parallel combination.

2. The power amplifier of claim 1, wherein the power transistor is an N-channel depletion mode Metal Semiconductor Field Effect Transistor.

3. The power amplifier of claim 2, further comprising probe pads coupled to each end of each metal link.

4. The power amplifier of claim 3, further comprising a resistor for coupling the bias circuit to the gate of the power transistor.

5. The power amplifier of claim 4, further comprising a capacitor coupled to the gate of the power transistor for receiving the input signal.

6. A method for setting quiescent current comprising the steps of:

providing a drain-to-source voltage on a transistor;

providing a variable gate-to-source voltage on the transistor;

recording a gate-to-source voltage as a bias voltage value corresponding to a drain-to-source current of the transistor;

selecting a resistor and metal link combination from a group of resistor and metal link combinations; and opening at least one metal link in the resistor and metal link combination, thereby setting the gate-to-source voltage to substantially match the bias voltage value of the transistor.

7. The method of claim 6, wherein the step of selecting the resistor and metal link combination further includes reading associated entries for the resistor and metal link combinations from a memory table.

8. The method of claim 7, further including the step of placing probes on either side of the at least one metal link for injecting an energy sufficient for reflowing the at least one metal link and generating an open conduction path.

9. The method of claim 8, further including the step of applying a voltage potential to the probes for opening the at least one metal link.

10. A Radio Frequency (RF) amplifier, comprising:

a first transistor having a gate for receiving an input signal, a drain coupled for providing a first output signal, and a source coupled to a first power supply conductor;

a second transistor having a gate for receiving the first output signal, a drain coupled for providing a second output signal, and a source coupled to the first power supply conductor; and a bias circuit for generating a bias voltage for the gate of the first transistor and the gate of the second transistor to maintain a constant drain current, the bias circuit including, a plurality of parallel combinations comprising a metal link having an end serially coupled to a resistor, wherein each of the plurality of parallel combinations is coupled to the gate of the first transistor and the gate of the second transistor, and wherein the metal link can be selectively opened to provide an open conduction path.

11. The Radio Frequency (RF) amplifier of claim 10, wherein the first transistor and the second transistor are an N-channel depletion mode Metal Semiconductor Field Effect Transistor.

12. The Radio Frequency (RF) amplifier of claim 11, further comprising probe pads coupled to each end of each metal link.

13. The Radio Frequency (RF) amplifier of claim 10, further comprising a first resistor for coupling the bias circuit to the gate of the first transistor.

14. The Radio Frequency (RF) amplifier of claim 10, further comprising a second resistor for coupling the bias circuit to the gate of the second transistor.

15. The Radio Frequency (RF) amplifier of claim 10, further comprising a capacitor for coupling the input signal to the gate of the first transistor.

16. The Radio Frequency (RF) amplifier of claim 10, further comprising a capacitor for coupling the first output signal to the gate of the second transistor.

17. The Radio Frequency (RF) amplifier of claim 10, further comprising an RF choke coupled from the drain of the first transistor to a second power supply conductor.

18. The Radio Frequency (RF) amplifier of claim 10, wherein the first transistor and the second transistor and the bias circuit are processed on a Gallium Arsenide (GaAs) substrate.

* * * * *